US005639314A

United States Patent [19]

Kura et al.

[11] Patent Number: 5,639,314

[45] Date of Patent: Jun. 17, 1997

[54] PHOTOVOLTAIC DEVICE INCLUDING PLURAL INTERCONNECTED PHOTOELECTRIC CELLS, AND METHOD OF MAKING THE SAME

[75] Inventors: Tatsuya Kura; Seiichi Kiyama; Yasuaki Yamamoto, all of Moriguchi, Japan

[73] Assignee: Sanyo Electric Co., Ltd., Moriguchi, Japan

[21] Appl. No.: 457,400

[22] Filed: Jun. 1, 1995

Related U.S. Application Data

[62] Division of Ser. No. 269,263, Jun. 29, 1994.

[30] Foreign Application Priority Data

| | | | |
|---|---|---|---|
| Jun. 29, 1993 | [JP] | Japan | 5-158952 |
| Jul. 29, 1993 | [JP] | Japan | 5-187939 |
| May 24, 1994 | [JP] | Japan | 6-110035 |

[51] Int. Cl.[6] .......... H01L 31/05; H01L 31/18

[52] U.S. Cl. .......... 136/244; 136/245; 136/249; 437/2; 437/4; 437/173; 437/205; 437/228; 437/249

[58] Field of Search .......... 136/249 MS, 244; 437/2–5, 51, 66, 68, 173, 205, 228, 249

[56] References Cited

U.S. PATENT DOCUMENTS

| | | | |
|---|---|---|---|
| 4,156,309 | 5/1979 | Routh et al. | 437/2 |
| 4,184,894 | 1/1980 | Lindmayer et al. | 136/249 MS |
| 4,219,368 | 8/1980 | David | 136/249 MS |
| 4,278,473 | 7/1981 | Borden | 136/249 MS |
| 4,605,813 | 8/1986 | Takeuchi et al. | 136/244 |
| 4,636,579 | 1/1987 | Hanak et al. | 136/245 |
| 4,754,544 | 7/1988 | Hanak | 437/2 |
| 4,882,239 | 11/1989 | Grimmer et al. | 429/7 |
| 5,081,049 | 1/1992 | Green et al. | 437/2 |
| 5,330,918 | 7/1994 | Dubbelday et al. | 437/2 |

FOREIGN PATENT DOCUMENTS

| | | | |
|---|---|---|---|
| 56-43774 | 4/1981 | Japan | 136/245 |
| 63-284871 | 11/1988 | Japan | 136/244 |

*Primary Examiner*—Aaron Weisstuch
*Attorney, Agent, or Firm*—W. G. Fasse; W. F. Fasse

[57] ABSTRACT

A method of fabricating a three-dimensionally shaped photovoltaic device involves first forming a photovoltaic element on a flexible substrate, preferably while it is flat, and then deforming the substrate to achieve the three-dimensional shape. Preferably a crystalline photovoltaic conversion layer is first formed on the flat substrate, then the layer is cut or divided while leaving the substrate uncut to form a plurality of separate adjacent photovoltaic elements on the substrate, and finally the substrate is deformed into the three-dimensional shape. The cutting can be carried out by laser irradiation. The deforming can be carried out by providing a shape memory member as the substrate, or bonding a shape memory member onto the substrate, and then restoring the shape memory member to its previously memorized three-dimensional shape. The adjacent photovoltaic elements can be electrically interconnected in series with each other by applying bond wires or an insulating film and then a conducting film in the cut regions between adjacent photovoltaic elements.

17 Claims, 14 Drawing Sheets

PRIOR ART FIG. 31
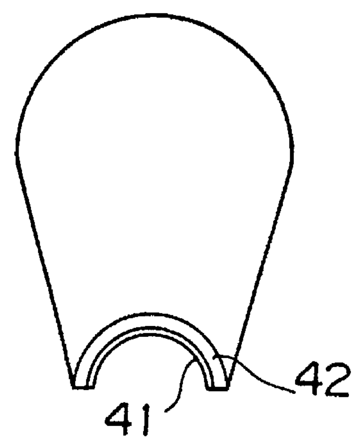
PRIOR ART FIG. 32
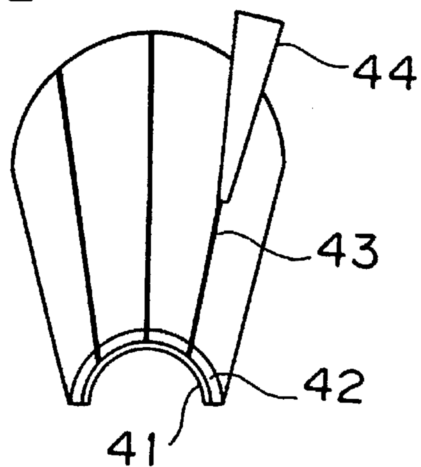
PRIOR ART FIG. 33
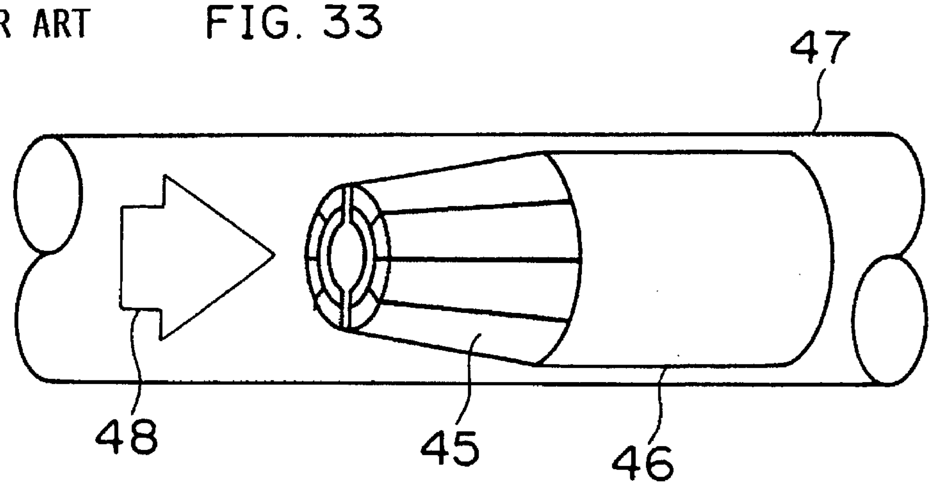

PHOTOVOLTAIC DEVICE INCLUDING PLURAL INTERCONNECTED PHOTOELECTRIC CELLS, AND METHOD OF MAKING THE SAME

CROSS-REFERENCE TO RELATED APPLICATION

This is a divisional of U.S. patent application Ser. No. 08/269,263, filed Jun. 29, 1994.

BACKGROUND OF THE INVENTION

1. Field of the Invention

The present invention relates to a photovoltaic device and a method of fabricating the same. More particularly, it relates to a method of fabricating a three-dimensionally shaped photovoltaic device having three-dimensionally arranged photovoltaic elements.

2. Description of the Background Art

FIG. 13 is a sectional view showing an exemplary module structure of a conventional photovoltaic device. A plurality of photovoltaic elements 3, which are separated from one another, are provided on a substrate 1, with electrode films 2 provided between the substrate 1 and the photovoltaic elements 3.

Electrode films 4 are provided on the photovoltaic elements 3. Wires 5 connect the electrode films 4 and 2 with each other between adjacent ones of the photovoltaic elements 3, thereby connecting the photovoltaic elements 3 in series with each other.

FIG. 14 is a side elevational view showing another exemplary module structure of a conventional photovoltaic device. An electrode 9 is provided on a first end of a photovoltaic element 6, while in turn a second end of the photovoltaic element 6 is connected with a first end of a photovoltaic element 7, and a second end of the photovoltaic element 7 is brought into contact with a first end of a photovoltaic element 8, of which a second end is provided with an electrode 10. In this manner, the photovoltaic elements 6, 7, and 8 are connected in series with each other.

However, such conventional photovoltaic devices require complicated fabrication steps, for example for wire bonding between the electrodes and for contact/fixation at the ends of the photovoltaic elements.

While it is necessary to connect a number of photovoltaic elements having small areas in series with each other in order to generate high-voltage power in a given area, it is also difficult to connect such photovoltaic elements having small areas with each other by means of the conventional connection structures.

FIGS. 30 to 32 are perspective views showing an exemplary method of fabricating a conventional three-dimensional shape photovoltaic device. This three-dimensional shape photovoltaic device is adapted to be arranged on a micromachine or the like. A photovoltaic device having such a three-dimensional shape is restricted to a thin film of an amorphous semiconductor or the like because it is generally difficult to form such a device from a crystalline semiconductor film. As shown in FIG. 30, a substrate 41 having a final three-dimensional shape is first prepared. A plurality of such substrates 41 are combined with each other to attain a truncated conical shape, in order to make a three-dimensional shape photovoltaic device finally having such a truncated conical shape.

Then, a photovoltaic element layer 42 having a p-n junction is formed on the overall surface of the substrate 41, as shown in FIG. 31.

Then, prescribed portions of the photovoltaic element layer 42 are irradiated with an energy beam 44 such as a laser beam to define divided portions 43, so that the photovoltaic element layer 42 is separated into a plurality of photovoltaic elements separated from one another along the divided portions 43.

After the photovoltaic element layer 42 is separated in the aforementioned manner, the respective photovoltaic elements are wired to be connected in series with each other.

FIG. 33 is a perspective view showing a truncated conical photovoltaic device 45 which has been formed by combining a plurality of the aforementioned photovoltaic elements with each other and which is carried or mounted on a micromachine 46. The micromachine 46 carrying such a photovoltaic device 45 can be introduced into a tube 47 as shown in FIG. 33, for example, whereby the micromachine 46 can advance itself through the tube 47. In this case, a driving unit which can move on an inner wall of the tube 47 is mounted on the micromachine 46, and power is generated in the photovoltaic device 45 which is irradiated with light 48. Thus, the micromachine 46 moves in the tube 47 by means of the power generated on board the machine 46 in the photovoltaic device 45.

However, it is difficult to fabricate a three-dimensional shape photovoltaic device by such a conventional method, because it is necessary to form the photovoltaic element layer on the substrate having a three-dimensional shape. Further, it is impossible to fabricate such a photovoltaic device having excellent photoelectric conversion characteristics. In addition, the fabrication steps are complicated, because it is necessary to separate the photovoltaic element layer after it is formed and to connect wires to the separated photovoltaic elements.

SUMMARY OF THE INVENTION

It is an object of the present invention to provide a photovoltaic device having a simple module connection structure which can connect photovoltaic elements of small areas with each other, and a method of fabricating the same.

Another object of the present invention is to provide a method of simply fabricating a three-dimensional shape photovoltaic device having excellent photoelectric conversion characteristics as well as a photovoltaic device having a complicated three-dimensional shape.

According to a first aspect of the present invention, a photovoltaic device comprises a substrate, and a plurality of photoelectric conversion cells or layers, that are provided separated and divided from one another on the substrate. The conversion layers include first and second, opposite conductivity type semiconductor layers. The opposite side surfaces of adjacent photoelectric conversion layers are sloped or inclined toward each other as they extend toward the substrate. The device further comprises an insulating layer or film covering one of the opposite side surfaces of the adjacent photoelectric conversion layers and a substrate portion located below and exposed between the adjacent photoelectric conversion layers. The device still further comprises a conductive film provided on the insulating film for electrically connecting the first conductivity type semiconductor layer of one of the adjacent photoelectric conversion layers with the second conductivity type semiconductor layer of the other one of the adjacent photoelectric conversion layers.

According to the first aspect of the present invention, a method of fabricating the aforementioned photovoltaic device comprises the steps of providing a photoelectric conversion layer having first and second, opposite conductivity type semiconductor layers on a substrate, and then partially removing or working the photoelectric conversion layer by laser irradiation for dividing the layer into a plurality of photoelectric conversion layers or elements so that opposite side surfaces of adjacent photoelectric conversion layers or elements are sloped toward each other as they extend toward the substrate. The method further comprises forming an insulating film by photo-CVD through laser irradiation to cover one of the opposite side surfaces of the adjacent, divided photoelectric conversion layers and a substrate portion exposed between the adjacent photoelectric conversion layers. The method next comprises forming a conductive film on the insulating film by photo-CVD through laser irradiation for electrically connecting the first conductive semiconductor layer of one of the photoelectric conversion layers with the second conductivity type semiconductor layer of the other one of the photoelectric conversion layers.

According to the first aspect of the present invention, the semiconductor forming each photoelectric conversion layer may be in any one of amorphous, polycrystalline and single-crystalline forms, and can be prepared from silicon or a compound semiconductor such as GaAs.

The photovoltaic device according to the-first aspect of the present invention includes an insulating film and a conductive film arranged as described above. Accordingly, it is possible to connect the adjacent photoelectric conversion layers in series with each other by using the insulating film and the conductive film, which can be formed on small regions. Thus, it is possible to connect photoelectric conversion layers having small areas with each other in a simple structure.

According to the first aspect of the present invention, the insulating film is also formed on and covers the substrate portion exposed between the adjacent photoelectric conversion layers, whereby it is possible to prevent a leakage current from occurring between the photoelectric conversion layers and the substrate.

In the method according to the first aspect of the present invention, division of the photoelectric conversion layer as well as formation of the insulating film and the conductive film are carried out by laser irradiation, and it is possible to continuously carry out these processes by switching the compositions of the atmospheres in which the laser irradiation is carried out.

The insulating film which is formed according to the first aspect of the present invention can be prepared from $SiO_2$ or $Al_2O_3$. This insulating film can be formed by photo-CVD through laser irradiation under conditions shown in Table 1, for example.

TABLE 1

| Material | Reactive Gas | Light Source | Light Intensity (Rep. Rate) | Substrate Temperature | Deposition Rate |
|---|---|---|---|---|---|
| $SiO_2$ | $N_2O + SiH_4$ or $O_2 + Si_2H_6$ | ArF Excimer | 40 W/cm² (100 Hz) | ≦600° C. | 3000 Å/min |
| $Al_2O_3$ | $N_2O$ + $Al(CH_3)_3$ | KrF Excimer | 40 W/cm² | 300° C. | 2000 Å/min |

When the conductive film is formed by photo-CVD through laser irradiation, light sources and raw material gases shown in Table 2 can be employed, for example.

TABLE 2

| Laser(Wavelength) Metal | ArF Excimer (193 nm) | KrF Excimer (248 nm) |
|---|---|---|
| Fe | $Fe(CO)_5$ | $Fe(CO)_5$ |
| Cr | $Cr(CO)_6$ | $Cr(CO)_6$ |
| Mo | $Mo(CO)_6$ | $Mo(CO)_6$ |
| W | $W(CO)_6$ $WF_6$ | $W(CO)_6$ |
| Al | $Al(CH_3)_3$ $AlI_3$ | $Al(CH_3)_3$ $Al(C_4H_9)_3$ |
| Zn | $Zn(CH_3)_2$ | $Zn(CH_3)_2$ |
| Cd | $Cd(CH_3)_2$ | |
| Sn | $Sn(CH_3)_4$ | |
| In | $In(CH_3)_3$ InI | $In(CH_3)_3$ |
| Pt | — | $PT(PF_3)_4$ |
| Cu | CuHF | CuHF |
| Tl | TLI | — |
| Ti | TiI | TiI |
| $TiSi_2$ | $TiCl_4$, $SiH_4$ | — |

It should be understood that the photovoltaic device according to the first aspect of the present invention is not restricted to a device fabricated by the method according to the first aspect of the present invention. In the photovoltaic device according to the first aspect of the present invention, the plurality of divided or separated photoelectric conversion layers or elements are not restricted to those formed by partially removing or working an original continuous photoelectric conversion layer by laser irradiation. The original continuous photoelectric conversion layer may alternatively be removed or worked and divided into separate elements by another type of physical or chemical etching, or may be selectively divided into a plurality of layers during formation thereof, for example. Further, the insulating film and the conductive film are not restricted to those formed by photo-CVD through laser irradiation, but they may alternatively be formed by a thin film forming method employing masks or resist films.

In the photovoltaic device according to the first aspect of the present invention, the insulating film and the conductive film are arranged as described above, thereby connecting the separate photoelectric conversion layers or elements for serving as photovoltaic elements in series with each other. Thus, complicated wire bonding steps and the like are not required, dissimilarly to the prior art, and it is possible to readily form the module connection structure.

In the method according to the first aspect of the present invention, the opposite side surfaces of the adjacent photoelectric conversion layers are formed to slope toward each other as they extend toward the substrate, as explained above. Due to such inclination or slope of the side surfaces of the photoelectric conversion layers, the insulating film and the conductive film can be formed in the next steps by photo-CVD using laser irradiation. In the method according to the first aspect of the present invention, therefore, it is possible to divide the original photoelectric conversion layer as well as to form the insulating film and the conductive film by laser beam irradiation. Thus, it is possible to continuously carry out these steps by switching the composition of the atmospheres for the laser beam irradiation, thereby fabricating the photovoltaic device with excellent productivity. Since the insulating film and the conductive film are selectively formed by laser beam irradiation, it is also possible to apply the inventive method to connection of photoelectric conversion layers having small areas.

A method according to a second aspect of the present invention comprises the steps of forming a photovoltaic device on a flexible substrate and deforming the flexible substrate to bring the overall photovoltaic device into a three-dimensional shape.

According to the second aspect of the present invention, it is preferable that the method further comprises a step of cutting a prescribed portion of the photovoltaic device while leaving the flexible substrate uncut, thereby dividing the photovoltaic device into a plurality of photovoltaic elements arranged on a continuous, one-piece substrate. It is possible to deform the flexible substrate in the divided portion of the photovoltaic device, thereby bringing the overall photovoltaic device into a three-dimensional shape.

According to the second aspect of the present invention, the method can further comprise a step of bonding a shape memory member memorizing a prescribed three-dimensional shape to the flexible substrate. It is possible to deform the flexible substrate by restoring the shape memory member to the prescribed three-dimensional shape, thereby bringing the overall photovoltaic device into the three-dimensional shape.

A method according to a third aspect of the present invention comprises the steps of forming a photovoltaic device on a shape memory member that has memorized a prescribed three-dimensional shape, and bringing the overall photovoltaic device into a three-dimensional shape by restoring the shape memory member to the prescribed three-dimensional shape.

According to the third aspect of the present invention, it is preferable that the method further comprises a step of cutting a prescribed portion of the photovoltaic device while leaving the shape memory member uncut, thereby dividing the photovoltaic device into a plurality of photovoltaic elements arranged on the continuous, one piece shape memory member.

The flexible substrate employed in the present invention is not particularly restricted as long as it has flexibility, and it can be formed by a thin metal plate of stainless steel or aluminum, or a resin film of polyimide or the like, for example. The thickness of the flexible substrate is not particularly restricted, as long as it is within a range having flexibility. The flexible substrate is generally about 10 to 1000 μm in thickness, when it is formed by a thin metal plate of stainless steel or aluminum, or a resin film of polyimide or the like.

The photovoltaic device employed in the present invention is not particularly restricted, and can be in an amorphous, polycrystalline or single-crystalline form and can be prepared from Si or a compound semiconductor such as GaAs.

The shape memory member employed in the present invention is not particularly restricted, and can be prepared from a shape memory alloy, shape memory resin or shape memory ceramic, for example. Shape memory alloys can be roughly classified into nonferrous and ferrous shape memory alloys. Examples of the non-ferrous shape memory alloys are Ag—Cd, Au—Cd, Cu—Zn, Cu—Zn—X (X=Si, Sn, Al or Ga), Cu—Al—Ni, Cu—Sn, Cu—Au—Zn, Ni—Al, Ti—Ni, In—Tl, In—Cd, and Mn—Cu. Examples of the ferrous shape memory alloys are Fe—Pt, Fe—Pd, Fe—Ni—Co—Ti, Fe—Ni—C, Fe—Mn—Si, and Fe—Cr—Ni—Mn—Si—Co. Examples of the shape memory resin are transpolyisoprene, polynorbornene, a styrene-butadiene copolymer, and polyurethane. Examples of the shape memory ceramics are ceramics derived from lead (Pb) zirconate titanate (PZT) and a soft piezoelectric material of lead (Pb) magnesium niobium (PMN). The thickness of the shape memory member employed in the present invention is not particularly restricted, but a thickness of about 2 to 100 μm is preferable.

In the method according to the second aspect of the present invention, the photovoltaic device is provided on a flexible substrate, which in turn is deformed so that the overall photovoltaic device is three-dimensionally shaped. Thus, a semiconductor layer for serving as part of the photovoltaic device can be formed on a flat flexible substrate. Further, the semiconductor layer as employed is not restricted to a thin film, whereby it is possible to employ a semiconductor having high crystallinity which can attain high photoelectric conversion characteristics. For example, it is possible to form a p-n junction in a silicon wafer on a flexible substrate, remove a prescribed portion of the wafer and deform the flexible substrate, thereby preparing a photovoltaic device having a three-dimensional shape.

Further, it is possible to bond a shape memory member that has previously memorized a prescribed three-dimensional shape to a flexible substrate and restore the shape memory member to the prescribed three-dimensional shape after bonding, thereby deforming the flexible substrate into the prescribed three-dimensional shape. It is possible to restore such a shape memory member by heating it through energization or from the exterior. Thus, it is possible to make the shape memory member memorize a complicated three-dimensional shape, flatten the shape memory member, bond it to the flexible substrate, and then restore the shape memory member to the complicated shape thereby deforming the flexible substrate to this complicated shape.

In the method according to the third aspect of the present invention, a flexible substrate is not employed. Instead, the photovoltaic device is directly formed on the shape memory member, which in turn is restored to its original shape.

The three-dimensional shape photovoltaic device obtained according to the present invention is three-dimensionally shaped by deformation of the flexible substrate or the shape memory member. Thus, it is possible to deform the flexible substrate or the shape memory member in conformity to the shape of a portion of the substrate or shape memory member provided with the photovoltaic device, thereby bringing the photovoltaic device into a complicated three-dimensional shape.

In the method according to each of the second and third aspects of the present invention, the flexible substrate or shape memory member provided with the photovoltaic device is so deformed that the overall photovoltaic device is three-dimensionally shaped. Thus, it is possible to form the photovoltaic device on a flat flexible substrate, which facilitates fabricating a photovoltaic device having excellent film quality.

According to each of the second and third aspects of the present invention, further, it is possible to fabricate a three-dimensional shape photovoltaic device using a rigid semiconductor member such as a silicon wafer. Thus, it is possible to fabricate a three-dimensional shape photovoltaic device having excellent photoelectric conversion characteristics using a single-crystalline semiconductor.

According to each of the second and third aspects of the present invention, the overall photovoltaic device is three-dimensionally shaped by deformation of the flexible substrate or shape memory member, whereby the three-dimensional shape can be freely set in response to the portion to be provided with the photovoltaic device.

It is also possible to use a shape memory member for deforming the photovoltaic device as described above. The shape memory member can be made to memorize a complicated three-dimensional shape since the shape memory member can be deformed into the complicated shape to memorize the shape while the member is in an independent state, i.e. separate from and prior to being bonded to the substrate or the photovoltaic elements. Thus, it is possible to bring the overall photovoltaic device into a complicated three-dimensional shape by employing the shape memory member.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 31 is a perspective view showing a photovoltaic element layer formed on the three-dimensional substrate in the conventional method;

FIG. 32 is a perspective view showing the three-dimensional photovoltaic element layer which is irradiated with a laser beam and divided in the conventional method; and FIG. 33 is a model diagram showing a three-dimensional photovoltaic device obtained in the conventional method and carried on a micromachine.

DESCRIPTION OF THE PREFERRED EMBODIMENTS AND OF THE BEST MODE OF THE INVENTION

Figure 1:
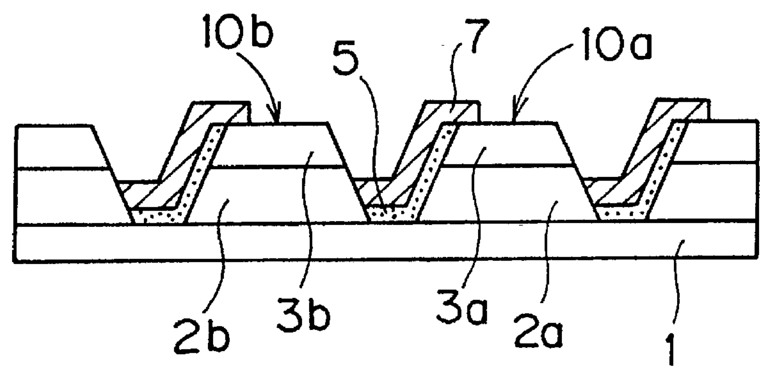
FIG. 1 is a sectional view showing an embodiment according to the present invention.

FIG. 1 is a sectional view showing a photovoltaic device of an embodiment according to a first aspect of the present invention. Referring to FIG. 1, a photoelectric conversion layer or element 10*a* comprising a p-type semiconductor layer 2*a* and an n-type semiconductor layer 3*a* stacked thereon, and a photoelectric conversion layer or element 10b comprising a p-type semiconductor layer 2b and an n-type semiconductor layer 3b stacked thereon are arranged adjacent one another on a substrate 1. The p-type semiconductor layers 2a and 2b and the n-type semiconductor layers 3a and 3b are prepared by diffusing a dopant into p-type semiconductor layers from surfaces thereof for forming n-layers, thereby forming p-n junctions. Opposite side surfaces of the photoelectric conversion layers or elements 10a and 10b are inclined or sloped toward each other as they extend toward the substrate 1. An insulating film 5 of $SiO_a$ is formed to cover the side surface of the photoelectric conversion layer 10a. A lower end of the insulating film 5 covers an upper portion of the substrate 1, and extends toward a lower portion of the p-type semiconductor layer 2b of the adjacent photoelectric conversion layer or element 10b. The insulating film 5 thus covers the portion of the substrate 1 located between the photoelectric conversion layers or elements 10a and 10b, thereby preventing occurrence of a leakage current.

A conductive film 7 of Al is formed on the insulating film 5 to electrically connect the n-type semiconductor layer 3a of the photoelectric conversion element 10a with the p-type semiconductor layer 2b of the photoelectric conversion element 10b. This conductive film 7 forms a module structure connecting the adjacent photoelectric conversion elements 10a and 10b in series with each other. In the photoelectric conversion elements 10a and 10b, as an alternative, the semiconductor layers 2a and 2b may be n-type and the semiconductor layers 3a and 3b may be p-type.

An embodiment of a method for fabricating the photovoltaic structure shown in FIG. 1 is now described.

Figure 2:
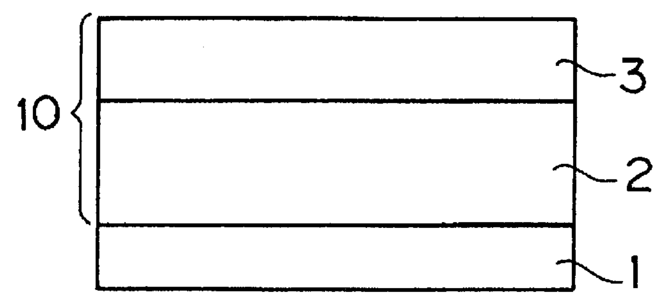
FIG. 2 is a sectional view showing a photoelectric conversion layer which is formed on a substrate.

Referring to FIG. 2, a p-type semiconductor layer of silicon, for example, is formed on a substrate 1. The p-type semiconductor layer is formed to be about 0.01 to 1 mm in thickness, for example. Then, a dopant is diffused into the semiconductor layer to form an n-type semiconductor layer 3 of not more than 1 μm in thickness, for example. Thus, the p-type semiconductor layer 2 and the n-type semiconductor layer 3 are immediately adjacent and connected with each other along a p-n junction to form a photoelectric conversion layer 10. The substrate 1 can be formed by a metal substrate of SUS stainless steel or the like, a transparent substrate of glass or quartz, or a resin substrate of a polymer or the like, for example. The substrate 1 is 1 to 3 mm in thickness, for example, when it is a glass substrate. On the other hand, the substrate 1 can be 0.01 to 1 mm in thickness, for example, in order to be flexible when it is a metal or a resin substrate.

Figure 3:
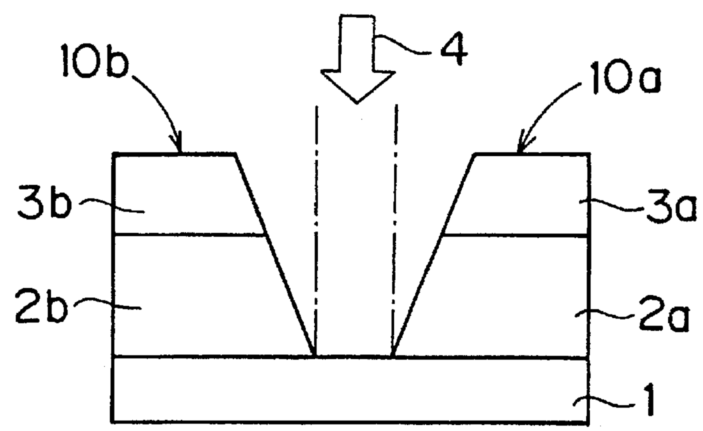
FIG. 3 is a sectional view showing the photoelectric conversion layer of FIG. 2 after it has been irradiated with a laser beam and divided into separate adjacent photoelectric conversion layers or elements.

Referring to FIG. 3, the photoelectric conversion layer 10 is then irradiated with a laser beam 4, to be partially removed and divided into separate adjacent photoelectric conversion layers or elements 10a and 10b. The photoelectric conversion element 10a is formed by a p-type semiconductor layer 2a and an n-type semiconductor layer 3a, while the photoelectric conversion element 10b is formed by a p-type semiconductor layer 2b and an n-type semiconductor layer 3b. The laser beam 4 has a wavelength of not more than 0.6 μm and an energy density of 0.01 to 10 $J/cm^2$, for example. In practice, the laser beam 1 was emitted from an ArF excimer laser of 193 nm wavelength, 10 $J/cm^2$ energy density and 30 nsec. pulse width. The beam intensity distribution of the laser beam 4 is given a trapezoidal profile so as to be stronger in the central portion than in the peripheral portions, thereby partially removing or working the photoelectric conversion layer 10 so that opposite side surfaces of the photoelectric conversion elements 10a and 10b define inclined or sloped surfaces as shown in FIG. 3. Such inclined surfaces may alternatively be formed by chemical laser etching.

Figure 4:
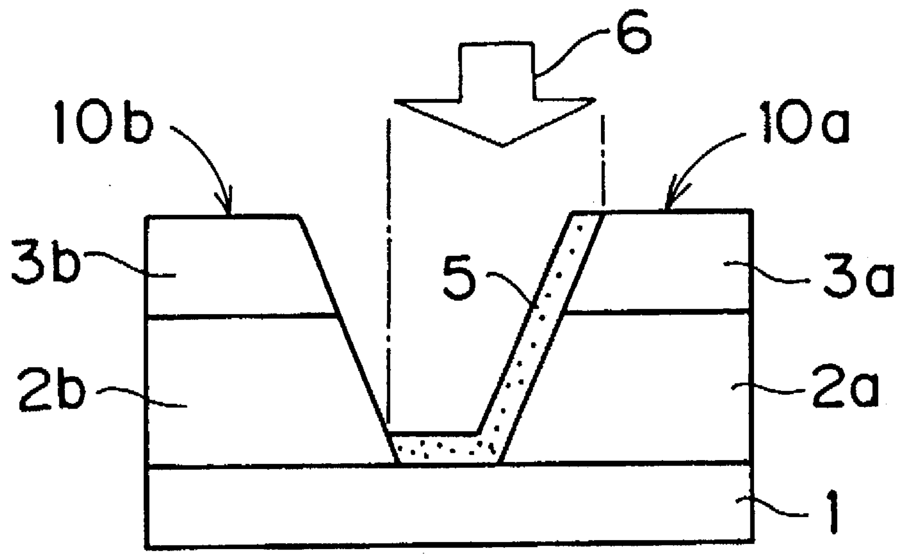
FIG. 4 is a sectional view showing an insulating film which is formed between the adjacent photoelectric conversion layers.

Referring to FIG. 4, an insulating film 5 is formed on the side surface of the photoelectric conversion element 10a by photo-CVD through application of a laser beam 6. As shown in FIG. 4, the laser beam 6 is selectively applied so that an upper end of the insulating film 5 covers the upper portion of the side surface of the photoelectric conversion element 10a while the lower end thereof covers the portion of the substrate 1 located between the photoelectric conversion elements 10a and 10b and the lower portion of the side surface of the p-type semiconductor layer 2b of the photoelectric conversion element 10b. The laser beam 6 is emitted from an ArF excimer laser in an $SiH_4+N_2O$ gas atmosphere, to form an $SiO_2$ thin film as the insulating film 5.

Figure 5:
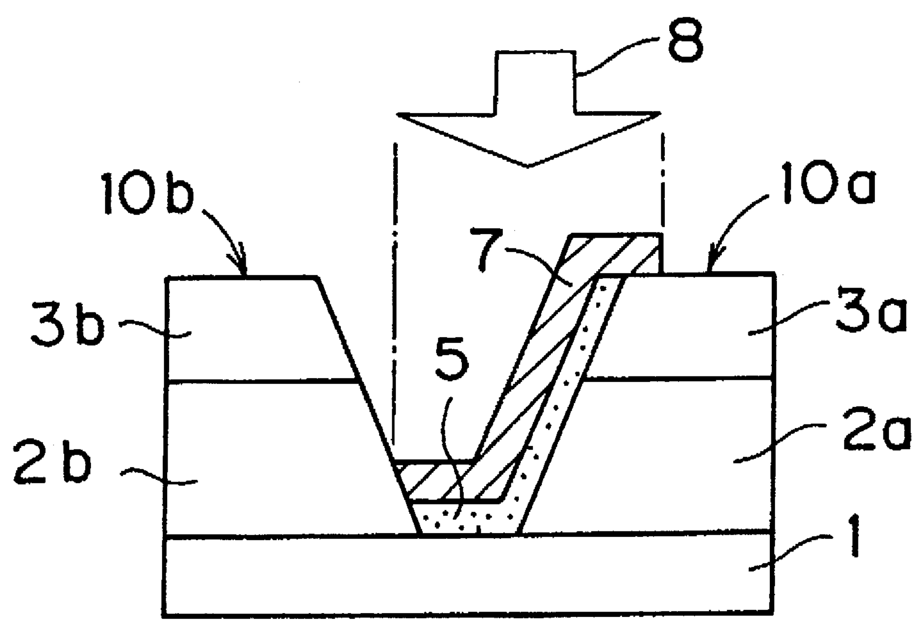
FIG. 5 is a sectional view showing a conductive film which is formed on the insulating film between the adjacent photoelectric conversion layers.

Referring to FIG. 5, a conductive film 7 is then formed by photo-CVD through application of a laser beam 8. The laser beam 8 is selectively applied so that the upper end of the conductive film 7 is in contact with the upper end surface of the n-type semiconductor layer 3a of the photoelectric conversion element 10a while the lower end thereof is in contact with the p-type semiconductor layer 2b of the photoelectric conversion element 10b. The laser beam 8 is emitted from an ArF Excimer laser in an $Al(CH_3)_3$ gas atmosphere thereby forming the conductive film 7 of Al.

In photo-CVD using laser beam irradiation, the laser beam generally has an energy density of not more than 3 $J/cm^2$. In practice, the laser beam 8 had an energy density of 0.1 to 1 $J/cm^2$. The insulating film and the conductive film may also be formed through photolithography and deposition techniques.

The photovoltaic device having the structure shown in FIG. 1 can be fabricated in the aforementioned manner.

In the embodiment shown in FIGS. 1 to 5, no upper surface collecting electrode is provided. This is because no collecting electrode is required when the structure according to the first aspect of the present invention is applied to photoelectric conversion layers which are divided into small areas, since the distance of movement of carriers is generally 0.1 to 5 mm.

Figure 6:
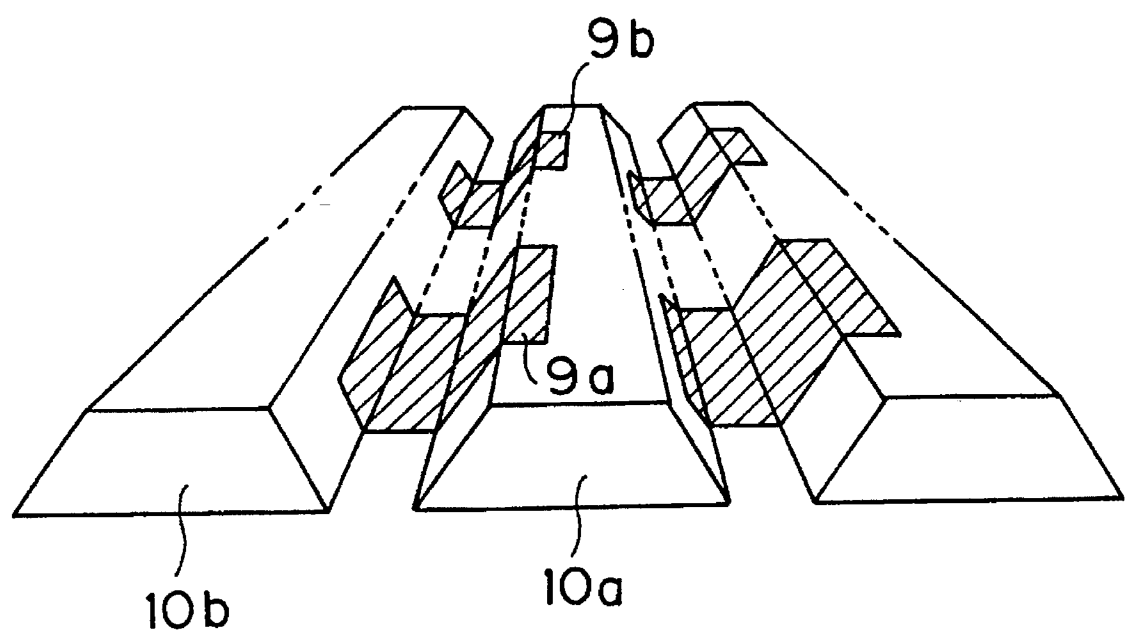
FIG. 6 is a perspective view showing an embodiment of connecting photovoltaic elements having small areas with each other according to the invention.

FIG. 6 is a perspective view showing an exemplary photovoltaic device having such photoelectric conversion layers or elements of small areas. Referring to FIG. 6, conductive films are provided between photoelectric conversion elements 10a and 10b for connecting these elements with each other. Regions 9a and 9b forming the conductive films are shown in a hatched manner in FIG. 6. In such a photovoltaic device, each photoelectric conversion element has an upper end surface about 0.1 to 4 mm in width, a lower end surface about 0.1 to 5 mm in width and a height of about 0.1 to 1 mm, with a distance of about 0.1 mm between the respective lower end portions of the adjacent photoelectric conversion elements, for example. When the distance between the conductive film forming regions 9a and 9b is twice the distance of movement of carriers, a complete or sufficient coverage of substantially all areas of the photoelectric conversion elements is achieved. Since the distance of movement of charge carriers is about 0.1 to 5 mm as described above, the distance between the conductive film forming regions 9a and 9b may be about 0.2 to 10 mm.

According to the first aspect of the present invention, it is possible to connect cells or elements of small areas in series with each other. Thus, the photovoltaic device according to the present invention is preferably applicable to a micromachine, as described later. Further, the present invention is also suitable for the structure of a photovoltaic device which is formed by dividing a cell having a wide area into a plurality of cells and connecting the divided cells in series with each other for deriving a high voltage. For example, it is possible to form a p-n junction in a silicon wafer which is placed on a support plate by a dopant diffusing method or a thin film forming method for providing a photoelectric conversion layer, divide the layer into a plurality of photoelectric conversion elements by a laser beam or the like, and then connect the divided photoelectric conversion elements in series with each other according to the first aspect of the present invention, thereby providing a photovoltaic device.

Figure 7:
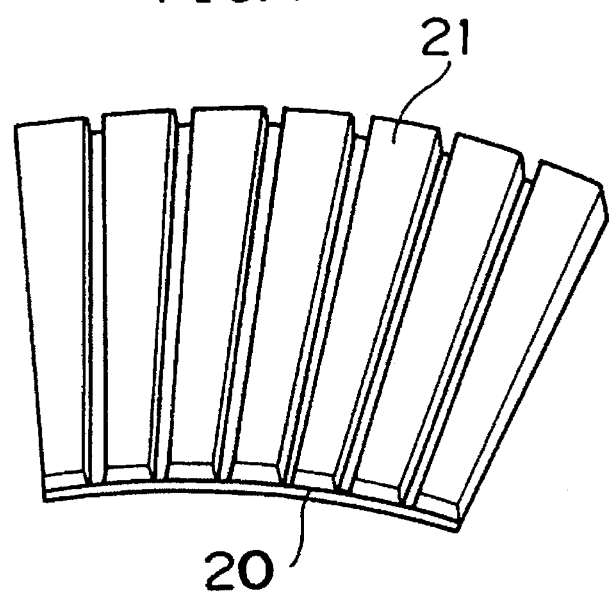
FIG. 7 is a perspective view showing photovoltaic elements for a micromachine.
Figure 8:
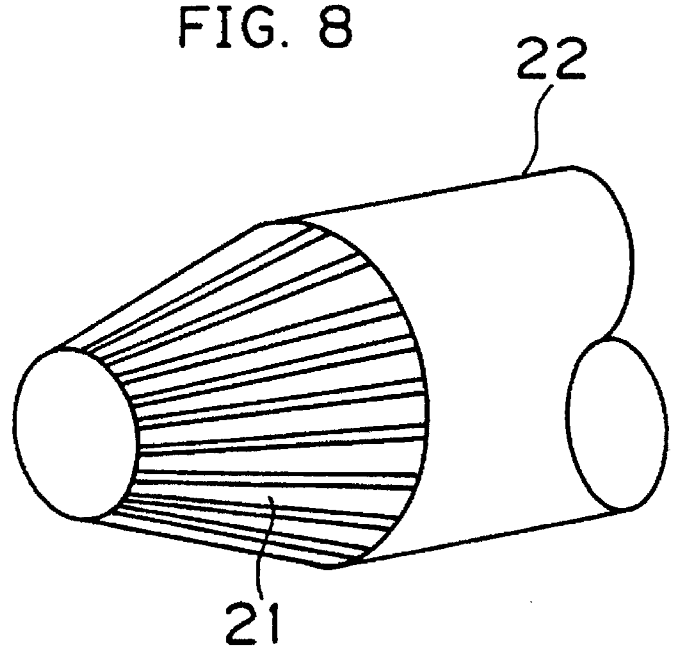
FIG. 8 is a perspective view showing the photovoltaic elements of FIG. 7 mounted or carried on a micromachine.

FIG. 7 is a perspective view showing a photovoltaic device according to the first aspect of the present invention, which is applied to a micromachine. Referring to FIG. 7, a plurality of photovoltaic elements 21 are dividedly provided on a flexible substrate 20 of polyimide or the like. The photovoltaic device shown in FIG. 7 can be bent along the flexible substrate 20 into a truncated conical shape, to be placed on a head portion of a micromachine 22 as shown in FIG. 8.

Figure 9:
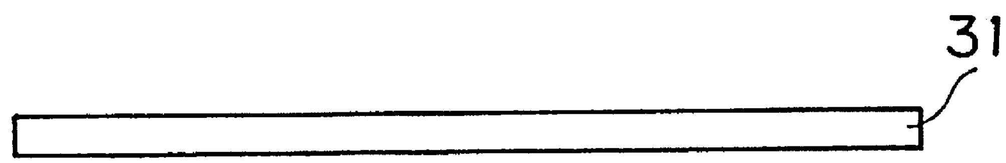
FIG. 9 is a sectional view showing a substrate employed for the photovoltaic device shown in FIG. 7.
Figure 10:
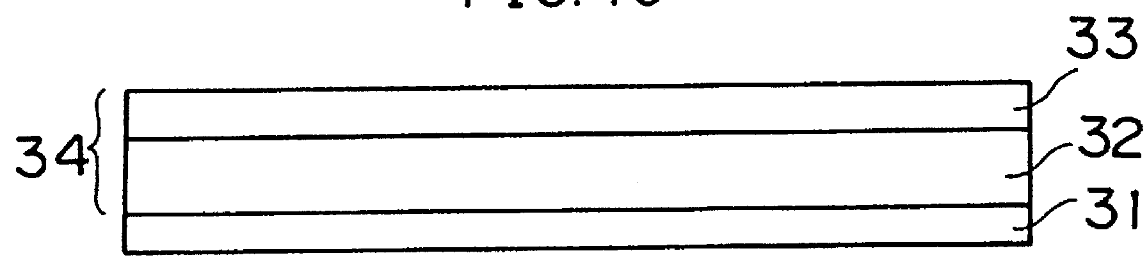
FIG. 10 is a sectional view showing the substrate with a photovoltaic conversion layer provided thereon.

Exemplary steps of fabricating such a photovoltaic device for a micromachine are now described. First, a substrate 31 is formed by a resin film of polyimide or the like as shown in FIG. 9. Alternatively, the substrate 31 may be a shape memory member according to a third aspect of the invention, as summarized above and described in further detail below. Next, a crystalline p-type semiconductor layer is provided on the substrate 31 and a dopant is diffused therein for forming an n-type semiconductor layer 33 and a p-type layer 32, thereby providing a photovoltaic device 34, as shown in FIG. 10.

Figure 11:
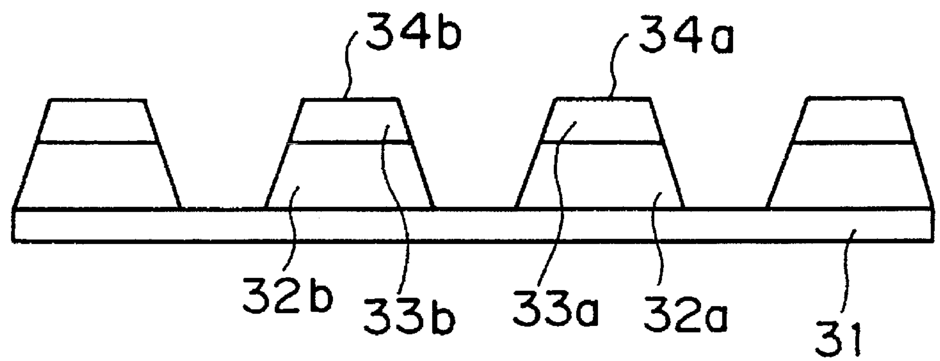
FIG. 11 is a sectional view showing the photovoltaic conversion layer of FIG. 10, having been divided on the substrate by irradiation with a laser beam to form a plurality of separate adjacent photovoltaic elements on the substrate.

Referring to FIG. 11, the photovoltaic device 34 is irradiated with a laser beam to be divided into a plurality of photovoltaic elements **34*a* and 34*b*. The divided photovoltaic elements 34*a* and 34*b* are formed by p-type semiconductor layers 32*a* and 32*b* and n-type semiconductor layers 33*a* and 33*b*** respectively.

Then, an insulating film 35 and a conductive film 37 are successively formed between the photovoltaic elements **34*a* and 34*b*** by photo-CVD using laser beam irradiation, similarly to the aforementioned embodiment.

Figure 12:
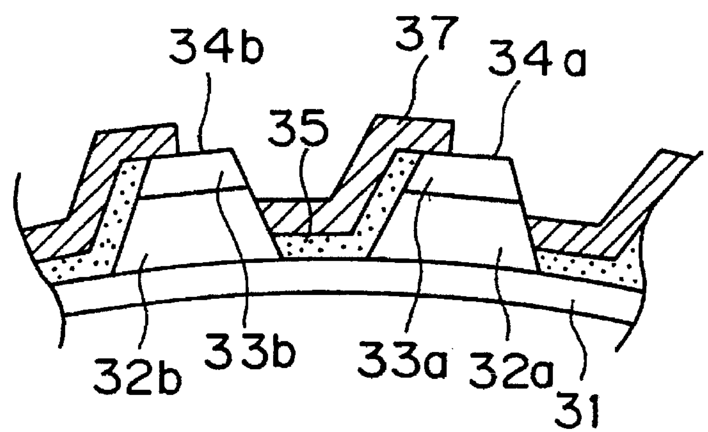
FIG. 12 is a sectional view showing the photovoltaic device of FIG. 11 mounted on a micromachine and having the respective photovoltaic elements connected with each other according to the present invention.
Figure 13:
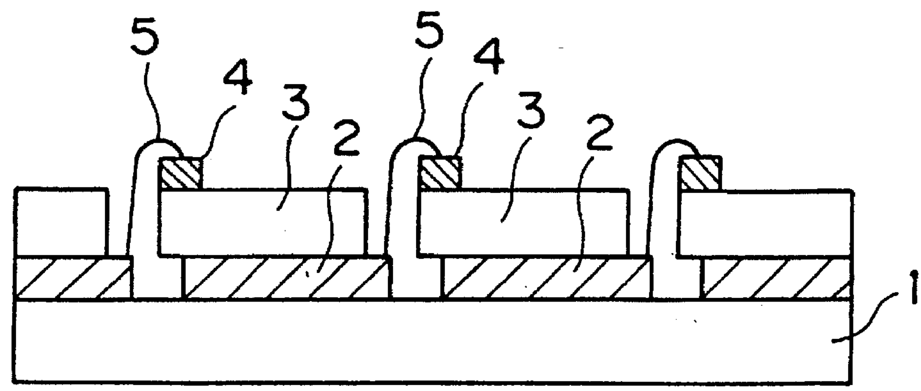
FIG. 13 is a sectional view showing an exemplary module connection structure of conventional photovoltaic elements.
Figure 14:
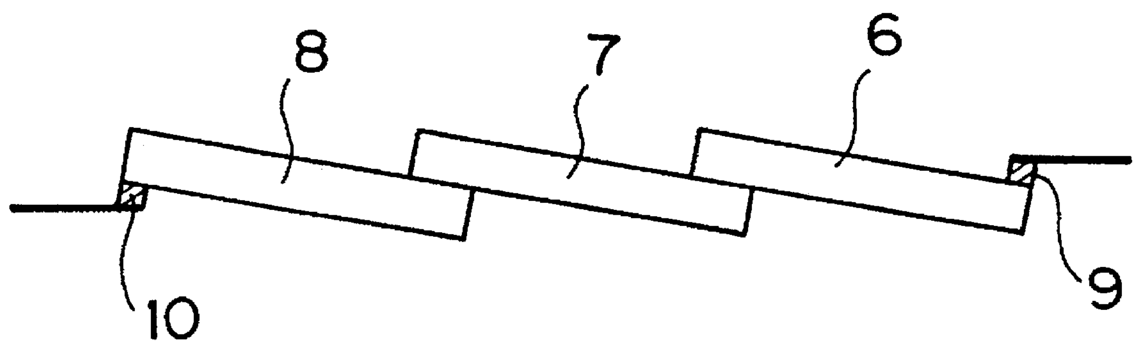
FIG. 14 is a side elevational view showing another exemplary module connection structure of conventional photovoltaic elements.

FIG. 12 is a sectional view showing the photovoltaic device, which is provided with the insulating film 35 and the conductive film 37 between the photovoltaic elements **34*a* and 34*b* and bent along the substrate 31** to be mounted on a micromachine.

Although the insulating film and the conductive film are formed between the photovoltaic elements to electrically connect the same with each other before the photovoltaic device is mounted on a micromachine according to this embodiment, the insulating and conductive films may be formed between the photovoltaic elements after the photovoltaic device is mounted on the micromachine, to electrically connect the photovoltaic elements with each other.

While the above embodiment has been described with reference to a photovoltaic device that does not have a collecting electrode, the present invention also applies to a structure that includes a collecting electrode.

Figure 15:
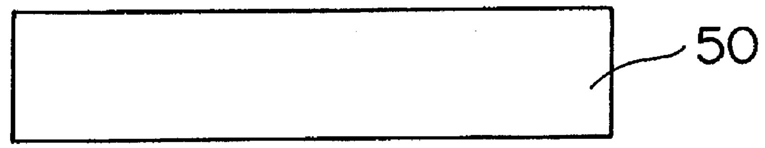
FIG. 15 is a sectional view showing a crystalline p-type silicon underlayer or substrate employed in an embodiment according to each of the second and third aspects of the present invention.
Figure 16:
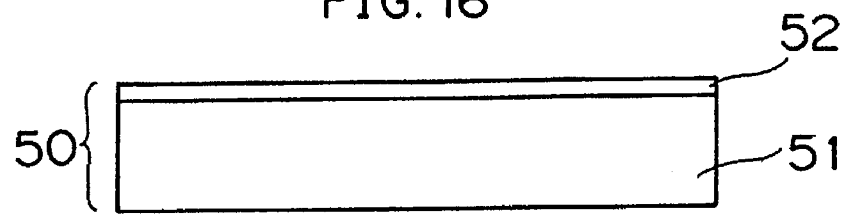
FIG. 16 is a sectional view showing an n layer formed on the p-type silicon substrate shown in FIG. 15.

FIGS. 15 to 20 are sectional views showing an embodiment of a method according to each of second and third aspects of the present invention. First, a crystalline p-type silicon substrate or underlayer 50 is prepared as shown in FIG. 15. Then, a dopant is diffused into the surface of the silicon substrate 50, to form an n layer 52 on this surface as shown in FIG. 16, thereby forming a p-n junction of a p layer 51 and the n layer 52.

Figure 17:
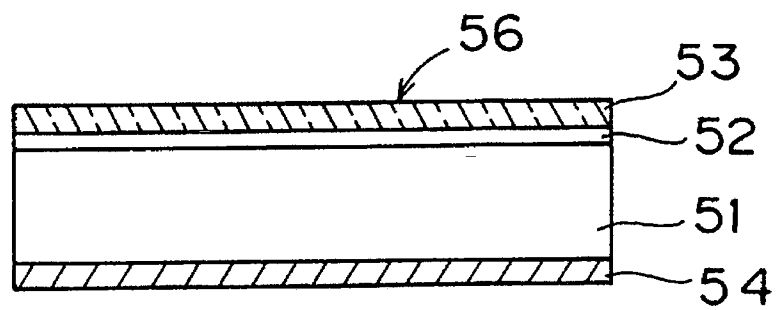
FIG. 17 is a sectional view showing a transparent conductive film and a metal electrode formed on the structure shown in FIG. 16 in the embodiment according to each of the second and third aspects of the present invention.

Referring to FIG. 17, a transparent conductive film 53 of ITO or the like is formed on the n layer 52 by CVD or the like. A metal electrode 54 of Ti or Al is formed on the backside of the p layer 51 by applying a metal paste or the like, thereby providing a photovoltaic device 56.

Figure 18:
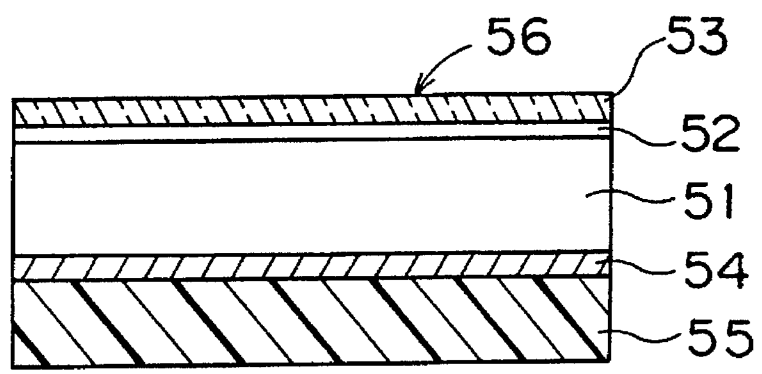
FIG. 18 is a sectional view showing a flexible substrate which is formed on the structure shown in FIG. 17 in the embodiment according to each of the second and third aspects of the present invention, wherein the substrate is a shape memory member according to the third aspect of the invention.

Referring to FIG. 18, a resin solution prepared by dissolving a resin such as polyimide is applied onto the metal electrode 54 by spin coating or the like for forming a resin film, thereby providing a flexible substrate 55. Alternately, the substrate 55 may be a shape memory member used according to a third aspect of the invention as summarized above and described in further detail below.

Figure 19:
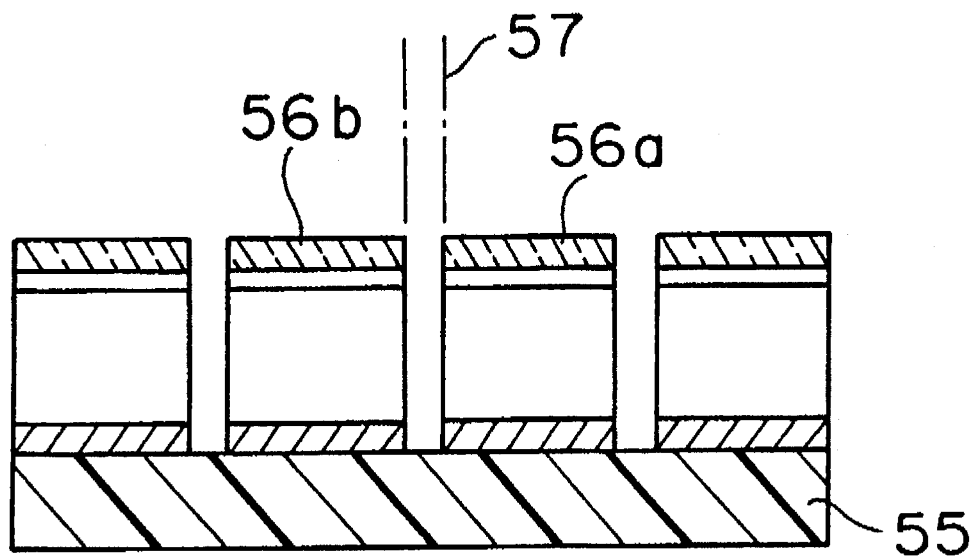
FIG. 19 is a sectional view showing the photovoltaic structure of FIG. 18 which has been irradiated with a laser beam and divided into a plurality of photovoltaic elements while leaving the flexible substrate undivided in the embodiment according to each of the second and third aspects of the present invention.

Referring to FIG. 19, a prescribed portion of the photovoltaic device 56 is irradiated with an energy beam 57 such as a laser beam, so that the device is divided into a plurality of photovoltaic elements **56*a* and 56*b*. In this irradiating operation, it is necessary to cut only the photovoltaic device 56 while leaving the flexible substrate 55 uncut. In order to carry out such selective working, the energy beam 57** is applied in a reactive gas, which is selected depending on the work piece. A reactive gas for Al is prepared from $BCl_3$, $SiCl_4$, $Cl_2$, $BBr_3$, HBr, $Cl_2/BCl_3$, $BCl_3/Cl_2/N_2$, $SiCl_4/Cl_2O_2$ or the like, for example. A reactive gas for Ti is prepared from $Cl_2$, $CF_4$, $Cl_2/Ar$, $CF_4/Ar$ or the like, for example. A reactive gas for amorphous silicon is prepared from $Cl_2$, $Cl_2/SF_6$, $CF_4/O_2$, $HBr/Cl_2$, $SF_4$, $BCl_3$ or the like, for example. A reactive gas for polycrystalline silicon is prepared from $Cl_2$, $Cl_2/SF_6$, $CF_4/O_2$, $HBr/Cl_2$, or the like, for example. A reactive gas for single-crystalline silicon is prepared from $CBrF_3$, $SiCl_4/Cl_2$, $Cl_2/SF_6$ or the like, for example. A reactive gas for GaAs is prepared from $Cl_2$, $BCl_3$, $Cl_2/BCl_3/CF_4$ or the like, for example.

The energy beam can be a pulsed or continuous beam of not more than 500 nm wavelength and having a spot or linear beam shape. The energy beam preferably has an energy density of 0.01 to 10 $J/cm^2$ in application.

Figure 20:
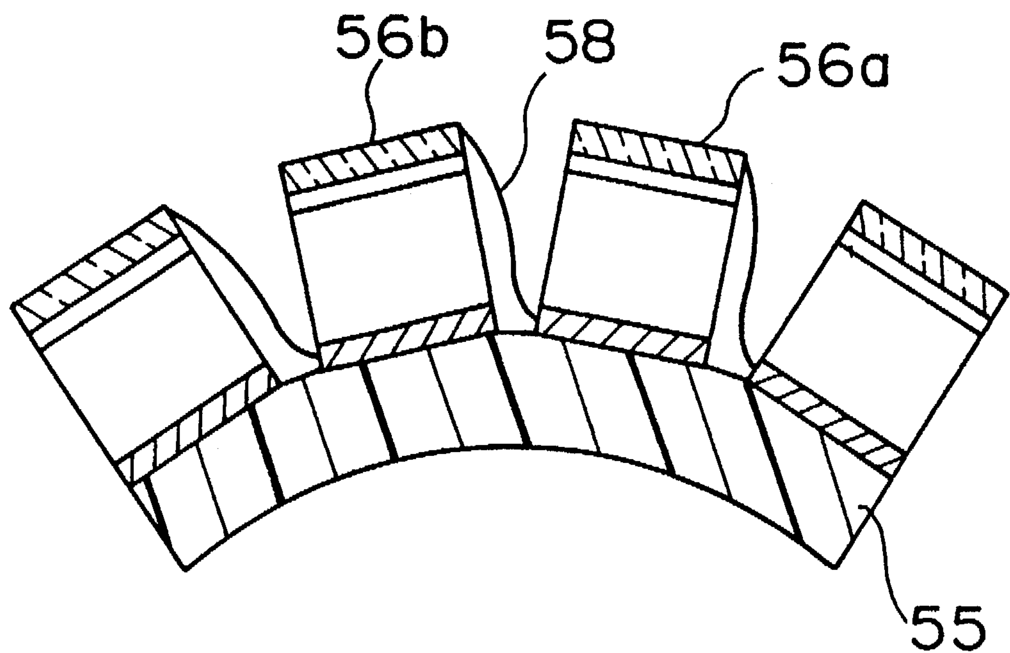
FIG. 20 is a sectional view showing the structure of FIG. 19, wherein the flexible substrate has been deformed into a three-dimensional shape after the photovoltaic device has been irradiated with the laser beam and divided into the photovoltaic elements in the embodiment according to each of the second and third aspects of the present invention.

Referring to FIG. 20, a wire 58 is connected across the photovoltaic elements **56*a* and 56*b* in the cut or divided portion of the photovoltaic device 56 that has been divided in the aforementioned manner, to connect the photovoltaic elements 56*a* and 56*b* in series with each other. Thereafter the flexible substrate 55 is bent, predominantly or only at the areas of the cuts made in the photovoltaic layer, into a prescribed three-dimensional shape. The method of wiring is not particularly restricted, but the wire 58 can alternatively be connected after the flexible substrate 55** is bent into the three-dimensional shape.

Figure 21A:
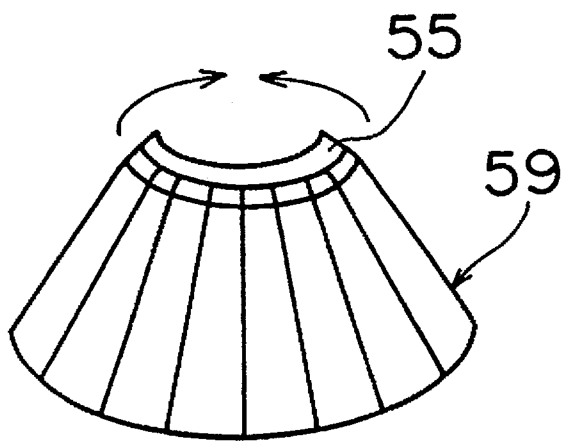
FIGS. 21A and 21B are perspective views showing the photovoltaic device in the embodiment according to each of the second and third aspects of the present invention, which is carried on a microomachine.
Figure 21B:
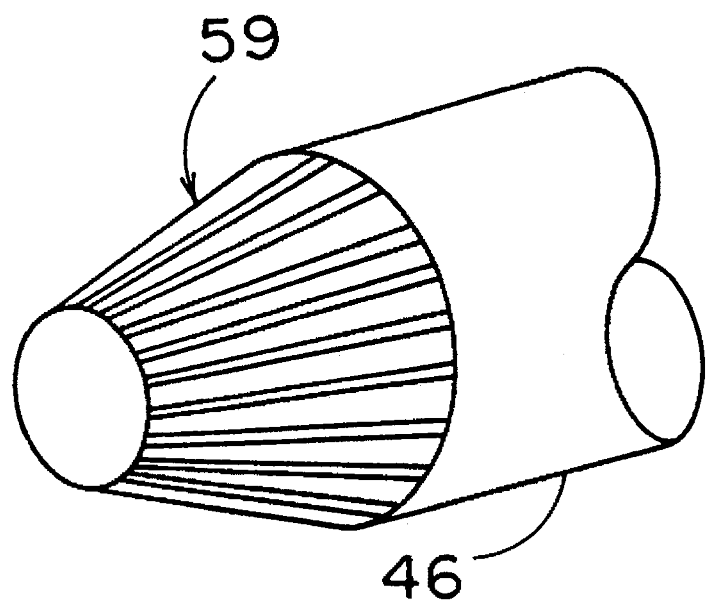

FIG. 21A shows a photovoltaic device 59 having a substantially sectorial shape and comprising the divided photovoltaic elements which are formed on the flexible substrate 55 in the aforementioned manner. The flexible substrate 55 is bent into a conical shape as shown by arrows in FIG. 21A, so that the photovoltaic device 59 can be mounted on a micromachine 46 as shown in FIG. 21B.

Figure 22:
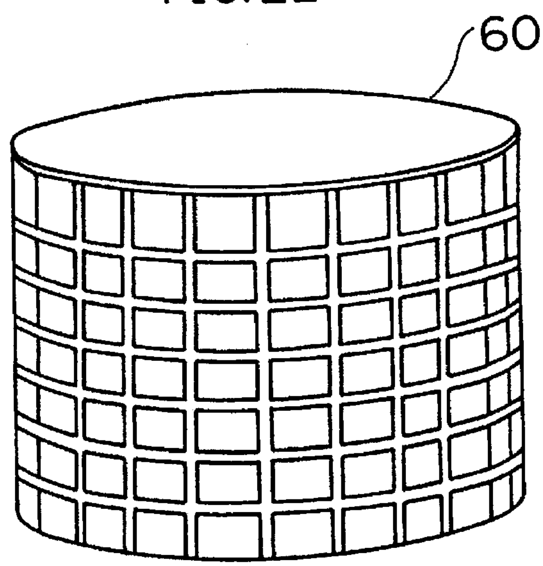
FIG. 22 is a perspective view showing a three-dimensional photovoltaic device in another embodiment according to each of the second and third aspects of the present invention.

The shape of the photovoltaic device fabricated by the method according to each of the second and third aspects of the present invention is not particularly restricted but a cylindrical photovoltaic device 60 can be formed as shown in FIG. 22, for example.

Figure 23:
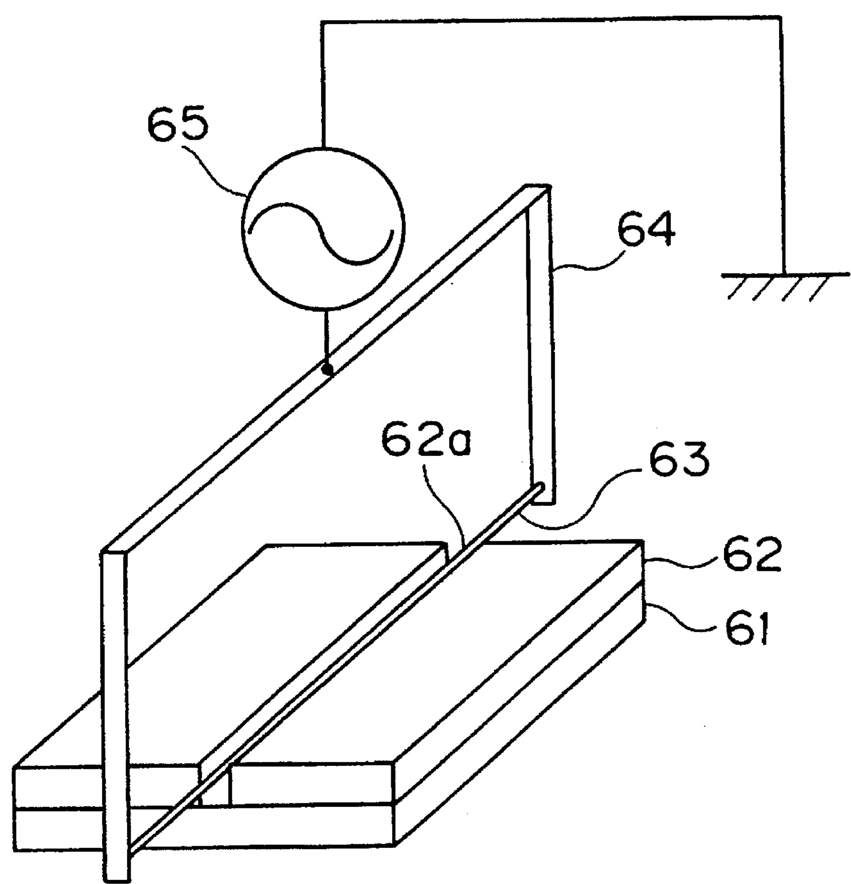
FIG. 23 is a schematic block diagram for illustrating the use of a linear plasma for removing or working a photovoltaic device according to each of the second and third aspects of the present invention.

Although an energy beam such as a laser beam is applied in a reactive gas to selectively cut and divide a photovoltaic device in the aforementioned embodiment, the present invention is not restricted to such a method. Instead, a plasma may be linearly generated in a reactive gas and applied to a photovoltaic device, thereby removing or working the same by radial reaction. FIG. 23 is a schematic block diagram illustrating such removal or working by a linear plasma. Referring to FIG. 23, a photovoltaic element layer 62 is formed on a flexible substrate 61. The two ends of a wire electrode 63 are supported by an electrode support frame 64. Power is applied from a high frequency power source 65 to the wire electrode 63 through the electrode support frame 64. Due to the application of such a high frequency voltage, a linear plasma is generated in the vicinity of the wire electrode 63. It is possible to remove a linear portion 62*a* from the photovoltaic element layer 62 by exposing the same to the linear plasma. A reactive gas employed for such plasma working can be similar to that employed in energy beam irradiation, as illustrated above with reference to the energy beam irradiation.

Figure 24:
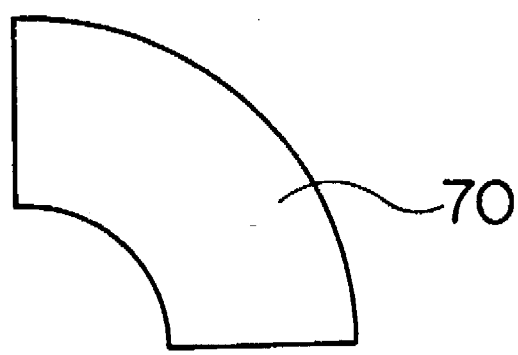
FIG. 24 is a plan view showing a shape memory member.
Figure 25:
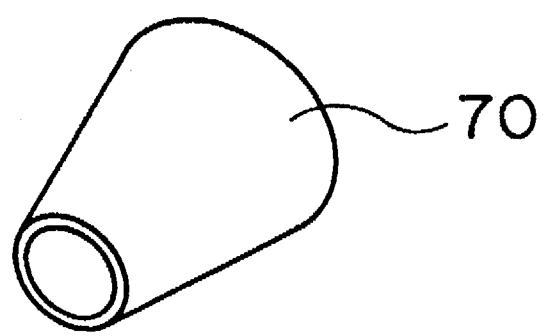
FIG. 25 is a perspective view showing a shape memorized in the shape memory member.

An embodiment employing a shape memory member is now described. FIG. 24 is a plan view showing a shape memory member 70 consisting of a shape memory alloy. This shape memory member 70 has a substantially sectorial shape. The shape memory member 70 is bent into a conical shape as shown in FIG. 25, and made to memorize this shape. Then, the shape memory member 70 is deformed into a substantially sectorial flat plate shape as shown in FIG. 26.

Figure 26:
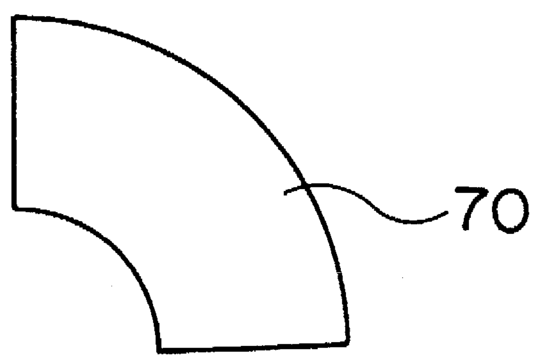
FIG. 26 is a plan view showing the shape memory member when it has been shaped into a plate after memorizing the shape.

Then, the substantially sectorial photovoltaic device 59 shown in FIG. 21A, which is formed on the flexible substrate 55, is bonded onto the shape memory member 70 shown in FIG. 26. This bonding can be an adhesion achieved with an adhesive or the like.

When a flexible substrate is formed by application of a resin solution which is prepared by dissolving a resin such as polyimide, the resin solution may be applied onto the metal electrode 54 of the photovoltaic device 56 shown in FIG. 17, to serve as an adhesive for bonding the shape memory member 70. In this case, the flexible substrate 55 also serves as an adhesive.

Figure 27:
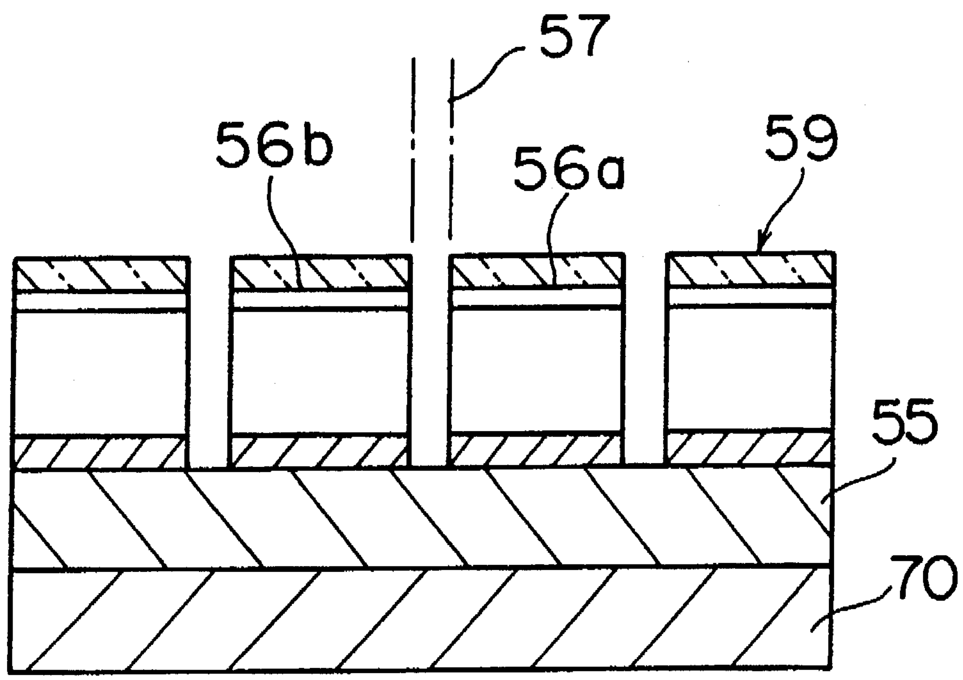
FIG. 27 is a sectional view showing the shape memory member bonded to a flexible substrate provided with photovoltaic elements.

FIG. 27 is a sectional view showing the shape memory member 70 which is bonded to the flexible substrate 55. As shown in FIG. 27, the shape memory member 70 is generally bonded to the side or surface of the flexible substrate 55 that is not provided with photovoltaic elements.

Figure 28:
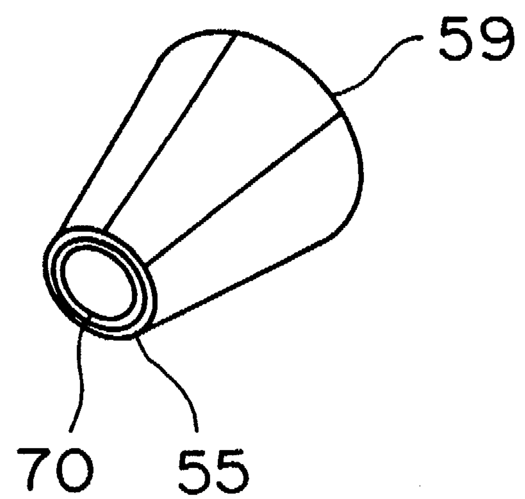
FIG. 28 is a perspective view showing the shape memory member bonded to the flexible substrate provided with the photovoltaic elements, when the shape memory member has been restored into the memorized shape.
Figure 29:
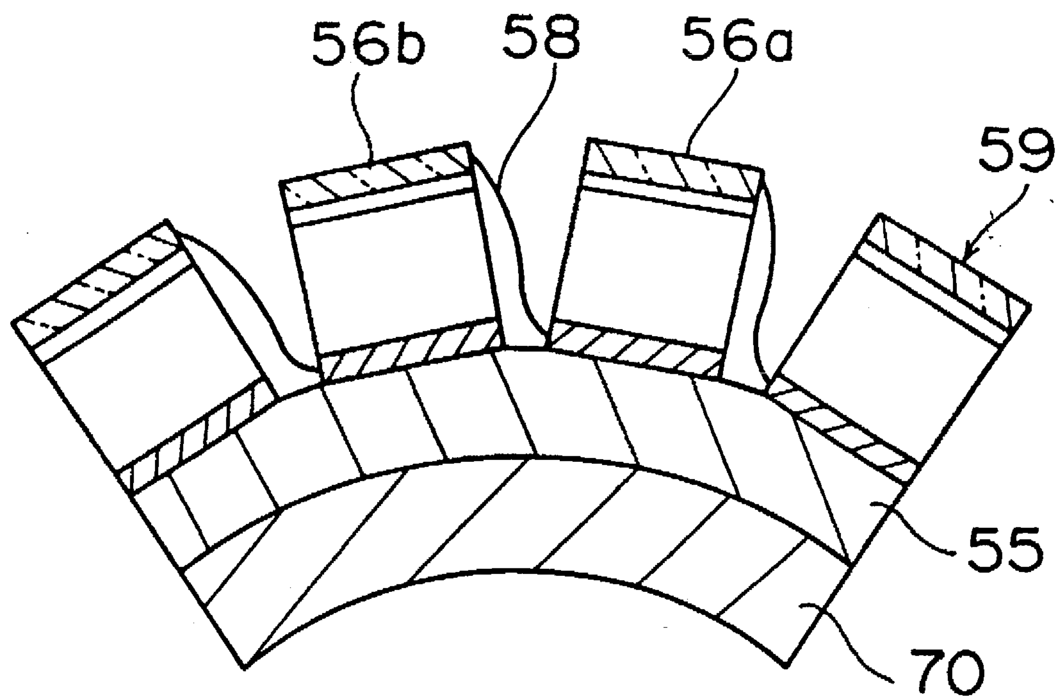
FIG. 29 is a sectional view of the structure shown in FIG. 28.
Figure 30:
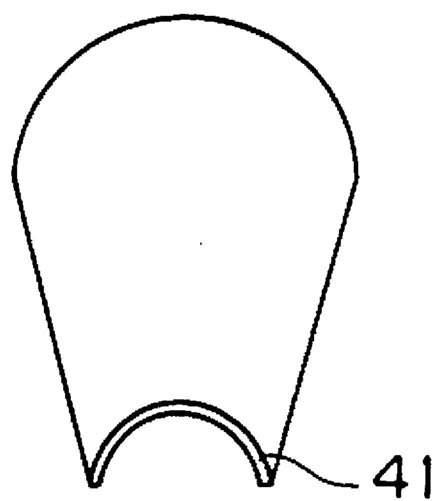
FIG. 30 is a perspective view showing a three-dimensional substrate employed in a conventional method.

Then, the shape memory member 70 is energized to be heated or is externally heated, so that it is restored to the memorized conical shape shown in FIG. 25. FIG. 28 is a perspective view showing the photovoltaic device 59 when the shape memory member 70 has been restored to its original shape. As shown in FIG. 28, the flexible substrate 55 is also conically deformed due to restoration of the shape memory member 70 to the conical shape, to be provided with a prescribed three-dimensional shape. FIG. 29 is a sectional view showing the photovoltaic device 59 after shape restoration.

As hereinabove described, it is possible to bond a shape memory member that has previously memorized a prescribed three-dimensional shape to a flexible substrate, and then restore the shape memory member to its original shape so as to deform the flexible substrate, thereby deforming the overall photovoltaic device into a three-dimensional shape.

Although the shape memory member is bonded to the flexible substrate in the aforementioned embodiment, an alternative embodiment according to the third aspect of the invention does not use a flexible substrate in addition to the shape memory member. A photovoltaic device may be directly formed on such a shape memory member, and then the shape memory member is restored to the memorized shape for forming a three-dimensional photovoltaic device. In such a photovoltaic device, the flexible substrate 55 shown in FIG. 19 is replaced by the shape memory member. The shape memory member is heated in order to restore the memorized shape for forming a three-dimensional photovoltaic device.

When a photovoltaic device is directly formed on a shape memory member having electrical conductivity, an insulating member is preferably provided between the shape memory member and the photovoltaic device.

In the present invention, a shape memory member may be a thin-film like member. For example, a thin film made of a shape memory material such as Ti—Ni is formed on a polyimide substrate to serve as a shape memory member. Alternatively, in the present invention, a shape memory member may be a wire-like member.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A flexible photovoltaic device comprising:

a flexible substrate;

a plurality of photoelectric conversion cells including crystalline semiconductor material and arranged on said substrate and separated from one another by a respective gap between adjacent first and second ones of said cells, wherein said adjacent cells have oppositely sloped sidewalls, wherein said gap is bounded at two opposite sides thereof by said sloping sidewalls so that said gap tapers toward said substrate and is bounded at a bottom thereof by an exposed portion of said substrate between said adjacent cells, wherein each said cell comprises a first semiconductor layer of a first conductivity type and a second semiconductor layer of a second conductivity type opposite said first conductivity type; and wherein said first and second semiconductor layers extend across said cell between said sloping sidewalls an insulating film arranged on and covering a first one of said opposite sloped sidewalls and said exposed portion of said substrate; and a conductive film arranged on said insulating film to extend entirely across a width of said insulating film to form a first electrical contact to said first semiconductor layer of said first adjacent cell and a second electrical contact to said second semiconductor layer of said second adjacent cell, wherein at least one of said electrical contacts is formed on one of said sloped sidewalls over an end edge of said insulating layer.

2. The photovoltaic device of claim 1, wherein said gap is an exclusively laser-cut gap, and wherein each of said insulating film and said conductive film is a film deposited by photo-CVD using laser irradiation.

3. The photovoltaic device of claim 1, further comprising a plurality of said conductive films arranged at intervals along said gap, said intervals being defined in relation to the distance of charge carrier movement so as to provide photocarrier collection coverage for all areas of said photoelectric conversion cells.

4. The photovoltaic device of claim 3, wherein said intervals are each not more than twice the distance of charge carrier movement.

5. The photovoltaic device of claim 3, wherein said intervals are each in the range from about 0.2 mm to about 10 mm.

6. The photovoltaic device of claim 1, wherein said sloped sidewalls are each defined substantially by a respective inclined plane extending smoothly without any step from said substrate to a top surface of a respective one of said cells.

7. The photovoltaic device of claim 6, wherein said insulating film is arranged only on said first one of said opposite sloped sidewalls and on said exposed portion of said substrate, without extending onto said top surface of said cell and without extending up on a second one of said sloped sidewalls opposite said first sidewall.

8. The photovoltaic device of claim 1, wherein each said photoelectric conversion cell consists essentially of only said first and second semiconductor layers, in a stacked arrangement directly on said substrate.

9. The photovoltaic device of claim 1, wherein said first and second semiconductor layers each extend entirely across a respective one of said cells parallel to said substrate and each have respective sloped edges that together form a respective one of said sloped sidewalls.

10. A method of fabricating a photovoltaic device, comprising the following steps:

(a) providing on a substrate a photoelectric conversion layer including a first semiconductor layer of a first conductivity type and a second semiconductor layer of an opposite, second conductivity type;

(b) removing a portion of said photoelectric conversion layer to form therethrough a gap having a bottom surface defined by an exposed portion of said substrate and having opposite sloped sidewalls so that said gap tapers toward said bottom surface, wherein said gap divides said conversion layer into a plurality of photoelectric conversion cells with respective side edges defined by said sloped sidewalls;

(c) forming an insulating film, by photo-CVD using laser irradiation, on and covering one of said opposite sloped sidewalls and said exposed portion of said substrate; and (d) forming a conductive film, by photo-CVD using laser irradiation, on said insulating film to extend across said insulating film and make electrical contact with said first semiconductor layer of one of said cells on one side of said gap and with said second semiconductor layer of a second one of said cells on a second side of said gap.

11. The method of claim 10, wherein said step (b) comprises irradiating said portion of said conversion layer with a laser beam.

12. The method of claim 11, wherein said steps (b), (c), and (d) are carried out in direct succession, while providing respective process gas atmospheres having respective different compositions for said respective laser irradiations of said steps (b), (c), and (d).

13. The method of claim 12, wherein said steps (b), (c), and (d) are carried out in immediate continuation of one another while substantially continuously maintaining said laser irradiation throughout said steps (b), (c) and (d).

14. The method of claim 13, further comprising altering at least one of a laser beam width and a laser beam intensity for said laser irradiation between said steps (b), (c), and (d).

15. The method of claim 11, wherein said laser beam has a beam intensity profile with a higher intensity portion at a central area of said beam and a lower intensity portion at peripheral areas of said beam.

16. The method of claim 15, wherein said beam intensity profile has a substantially trapezoidal shape, with said higher intensity portion having a substantially uniform intensity over said central area, and said lower intensity portion having a tapering intensity that decreases from said central area through said peripheral areas.

17. The method of claim 10, wherein said step (b) comprises removing said portion by photolithography.

* * * * *

UNITED STATES PATENT AND TRADEMARK OFFICE

CERTIFICATE OF CORRECTION

PATENT NO. : 5,639,314

DATED : Jun. 17, 1997

INVENTOR(S) : Kura et al.

It is certified that error appears in the above-indentified patent and that said Letters Patent is hereby corrected as shown below:

On the Title Page:

In "Foreign Application Priority Data" replace the first line to read as follows:
--Jun. 29, 1993 [JP] Japan .................. 5-158982--.

In Col. 3, Table 1, column 5, replace the heading to read:
--Substrate Temperature--;
Table 1, column 6, replace the heading to read:
--Deposition Rate--.

In Col. 9, line 11, replace "$SiO_a$" by --$SiO_2$--.

Signed and Sealed this

Twenty-eighth Day of October, 1997

*Attest:*

BRUCE LEHMAN

*Attesting Officer*

*Commissioner of Patents and Trademarks*